United States Patent [19]

Sugimoto

[11] Patent Number: 4,999,631
[45] Date of Patent: Mar. 12, 1991

[54] HIGH-PRECISION AND HIGH-SPEED ANALOG/DIGITAL CONVERTER HAVING LOW POWER CONSUMPTION

[75] Inventor: Yasuhiro Sugimoto, Yokohama, Japan

[73] Assignee: Kabushiki Kaisha Toshiba, Kawasaki, Japan

[21] Appl. No.: 374,064

[22] Filed: Jun. 30, 1989

[30] Foreign Application Priority Data

Jul. 1, 1988 [JP] Japan .................. 63-164622

[51] Int. Cl.$^5$ .............................................. H03M 1/14
[52] U.S. Cl. .................................... 341/156; 341/159
[58] Field of Search ............................. 341/159, 156

[56] References Cited

U.S. PATENT DOCUMENTS

| | | | |
|---|---|---|---|
| 4,008,468 | 2/1977 | Imhoff et al. | 341/159 |
| 4,353,059 | 10/1982 | Vaitkus | 341/159 |
| 4,393,368 | 7/1983 | Rasmussen | 341/159 |
| 4,559,522 | 12/1985 | Sekino et al. | 341/159 |
| 4,612,531 | 9/1986 | Dingwall et al. | 341/156 |
| 4,745,393 | 5/1988 | Tsukada et al. | 341/159 |
| 4,752,766 | 6/1988 | Shimizu et al. | 341/159 |
| 4,768,016 | 8/1988 | Chu et al. | 341/159 |
| 4,866,444 | 9/1989 | Nejime et al. | 341/159 |
| 4,870,116 | 9/1989 | Mapleston | 341/159 |
| 4,875,048 | 10/1989 | Shimizu et al. | 341/159 |

OTHER PUBLICATIONS

U.S. patent application Ser. No. 311,256 filed by Hara et al., entitled "Semiconductor Device".
U.S. patent application Ser. No. 323,696 filed by Sugimoto et al., entitled "Current Switching Circuit".
U.S. patent application Ser. No. 355,610 filed by Sugimoto et al., entitled "Attenuator Circuit".
U.S. patent application Ser. No. 049,141 filed by Sugiyama et al., entitled "Booth's Conversion Circuit".
U.S. patent application Ser. No. 028,385 filed by Tsugaru et al., entitled "Input Circuit".
U.S. patent application Ser. No. 770,090 filed by Hara et al., entitled "Voltage Level Converting Circuit".
U.S. patent application Ser. No. 024,164 filed by Tsugaru et al., entitled "Voltage Output Circuit".
Sugimoto et al., "An Experimental BI-CMOS Video 10Bit ADC," Digest of Technical Papers, 1988 Symposium on VLSI Circuits, Aug. 1988.
Sugiyama et al., "Two Step Parallel ADC with Peripheral Analog and Digital Circuit", Technical Report of the Institute of Electronics & Information Communications Engineers of Japan, ICD87-53, pp. 13-17, Sep. 22, 1987.

Primary Examiner—William M. Shoop, Jr.
Assistant Examiner—Marc S. Hoff
Attorney, Agent, or Firm—Finnegan, Henderson, Farabow, Garrett and Dunner

[57] ABSTRACT

This invention discloses an analog/digital converter including comparator groups in which each comparator is constituted by bipolar transistors, for comparing reference voltages with an analog input voltage, and means for obtaining a digital converted value corresponding to the analog input voltage, in accordance with comparison results of in the comparator groups.

4 Claims, 6 Drawing Sheets

HIGH-PRECISION AND HIGH-SPEED ANALOG/DIGITAL CONVERTER HAVING LOW POWER CONSUMPTION

BACKGROUND OF THE INVENTION

1. Field of the Invention

The present invention relates to a high-speed/high-precision analog/digital converter having low power consumption.

2. Description of the Related Art

Conventional low power-consumption analog/digital converters, for converting analog signals into digital signals, are taught in, for example, "An 8 MHz 8b CMOS Subranging ADC", Andrew G. F. Dingwall, ISSCC 1985, Digest of Technical Papers, pp. 72–73, and in "Analysis and evaluation of CMOS chopper-type comparator", Kuboki et al., Journal of the Institute of Electronics and Communication Engineers of Japan, 84/5 Vol. J67-C No. 5, pp. 443–450.

Figure 1:
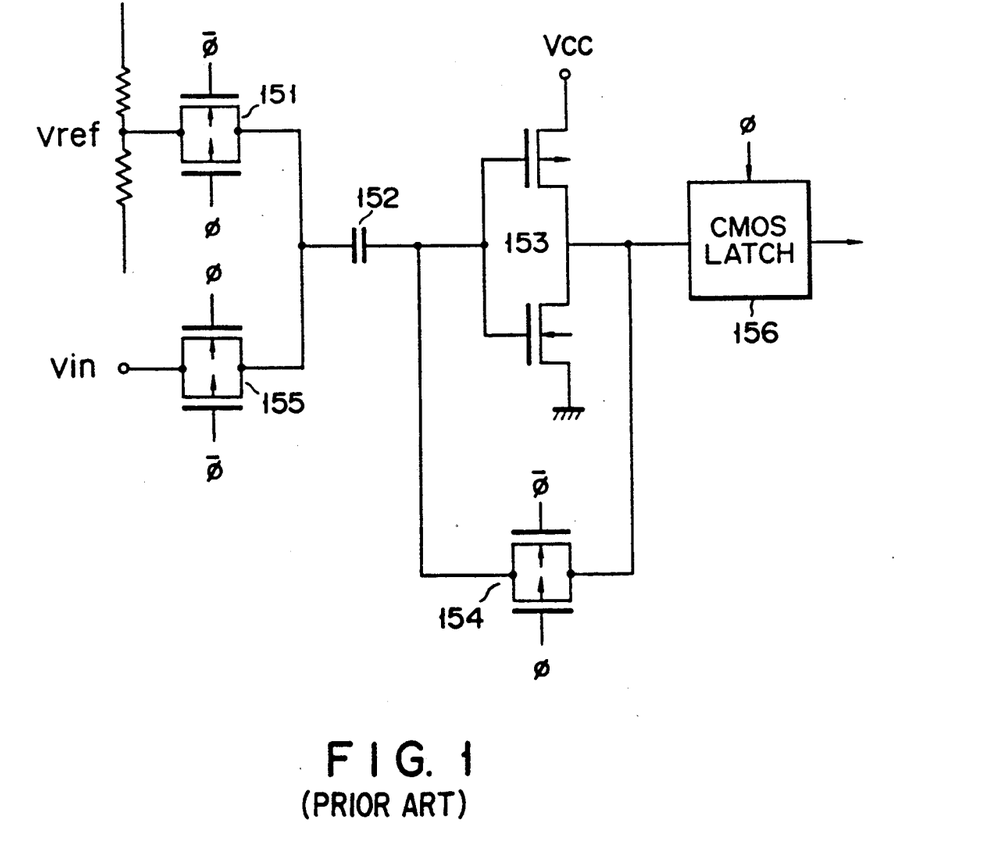
FIG. 1 is a circuit diagram showing an arrangement of a conventional CMOS chopper-type comparator.

FIG. 1 is a circuit diagram showing an arrangement of the CMOS chopper-type comparator disclosed in the former of the above two papers. A reference voltage Vref obtained by a resistor ladder circuit is supplied to one terminal of a capacitor 152 through a CMOS transfer gate 151. When the CMOS transfer gate 151 is kept enabled, the input and output terminals of a CMOS inverter 153, the input terminal of which is connected to the other terminal of the capacitor 152, are short-circuited through a CMOS transfer gate 154, and an operation point of the CMOS inverter 153 is determined. Then, a CMOS transfer gate 155 is enabled, and an analog input voltage Vin is supplied to one terminal of the capacitor 152. At this time, the CMOS transfer gate 154 is disabled, and an output from the CMOS inverter 153 is determined on the basis of a comparison result between the reference voltage Vref and the analog input voltage Vin. Thereafter, the output from the CMOS inverter 153 is latched by a CMOS latch circuit 156, in synchronism with a clock signal $\phi$. The number of CMOS chopper-type comparators is the same as that of the reference voltages obtained by the resistor ladder circuit.

However, even if an optimum circuit constant is set, in the case of the CMOS chopper-type comparator having the above arrangement, as disclosed in the former paper, the operation speed of the device is nevertheless limited. When the number of reference voltages Vref compared with the input voltage Vin is increased and bit precision is improved, the operation speed of the device is limited much more. For this reason, the conventional low power-consumption CMOS analog/digital converter is not suitable for performing digital conversion of a high-frequency analog signal such as a video signal, because a very low input voltage cannot be amplified to a CMOS level without an offset error. Therefore, although low power consumption can be realized in the conventional analog/digital converter having the CMOS arrangement, a very low analog input voltage having a high frequency cannot be digitally converted with high precision.

Summary of the Invention

It is an object of the present invention to provide an analog/digital converter for achieving high-precision digital conversion of a very low analog input voltage having a high frequency, but without incurring an increase in power consumption.

The analog/digital converter according to the present invention comprises comparator groups in which each comparator is constituted by bipolar transistors, for comparing a plurality of different reference voltages with an analog input voltage; and means for obtaining a digital converted value corresponding to the analog input voltage, in accordance with comparison results of the comparator groups.

An analog/digital converter according to the present invention comprises a first comparator group, in which each comparator is constituted by bipolar transistors, for comparing a plurality of different primary reference voltages with an analog input voltage; a latch circuit group having a latch circuit which is constituted by MOS transistors, for latching comparison results of the first comparator group; means for obtaining a first digital converted value corresponding to the analog input voltage, in accordance with storage contents of the latch circuit group; selecting means for selecting a high-level primary reference voltage approximate to the analog input voltage and a low-level primary reference voltage in accordance with the storage contents of the latch circuit group; secondary reference voltage generating means for dividing a potential difference between the high- and low-level primary reference voltages selected by the selecting means, so as to generate a plurality of secondary reference voltages; a second comparator group, in which each comparator is constituted by bipolar transistors, for comparing the plurality of secondary reference voltages generated by the secondary reference voltage generating means with the analog input voltage, means for obtaining a second digital converted value corresponding to the analog input voltage, in accordance with comparison results of the second comparator group; and means for obtaining a digital converted value corresponding to the analog input voltage, in accordance with the first and second digital converted values.

According to the present invention, the comparator groups for comparing the reference voltages with the analog input voltage are constituted by bipolar transistors, so that a high-speed operation can be realized, as compared with the case wherein comparators are constituted by CMOS transistors.

In addition, the latch circuit and the like, which are not required to operate at high-speed, are constituted by CMOS transistors, so that power consumption is not so increased.

DETAILED DESCRIPTION OF THE PREFERRED EMBODIMENT

An embodiment of the present invention will be described hereinafter, with reference to the accompanying drawings.

Figure 2:
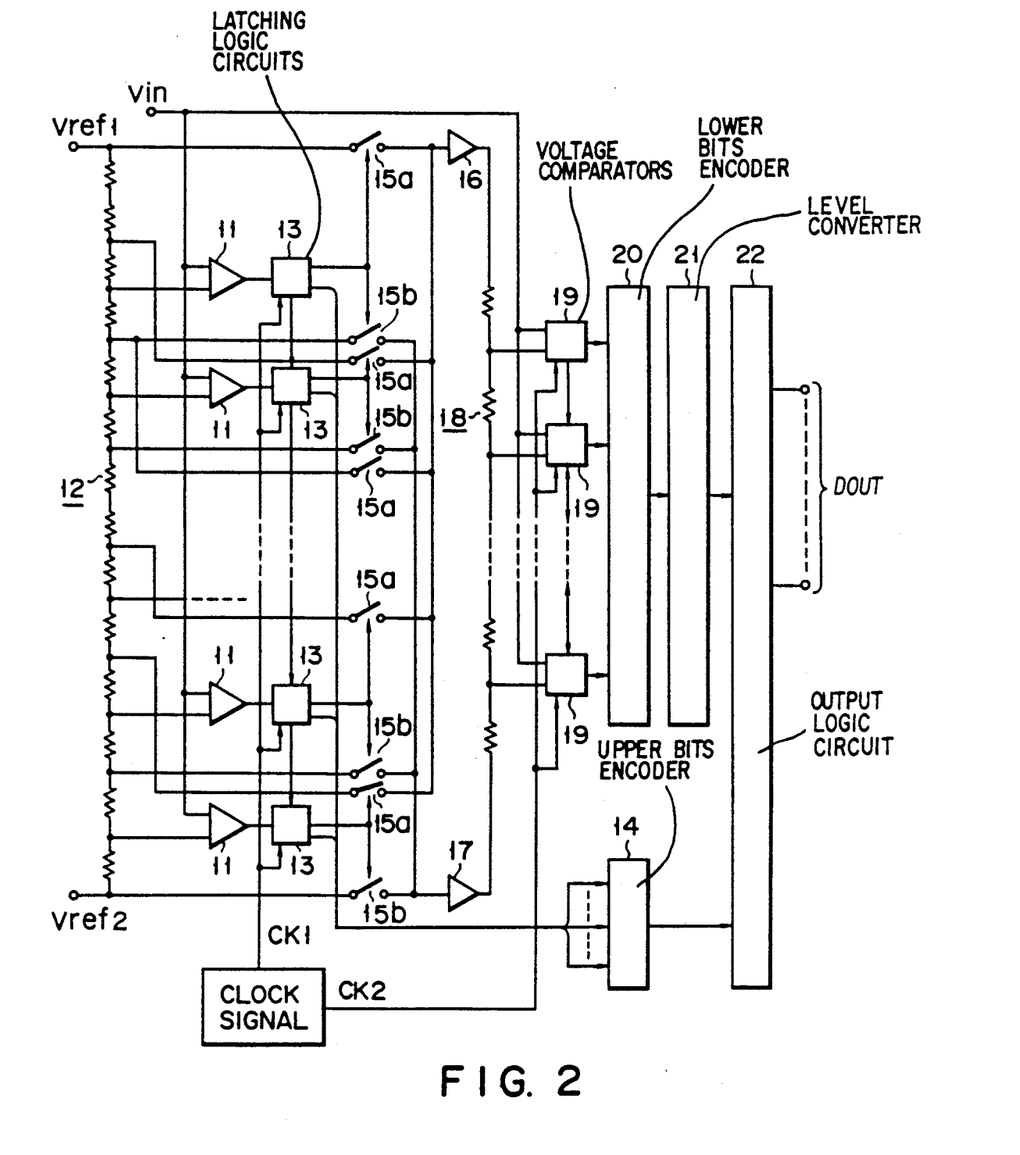
FIG. 2 is a circuit diagram showing the general arrangement of an analog/digital converter according to the present invention.

FIG. 2 is a circuit diagram showing the general arrangement of an analog/digital converter (hereinafter referred to as an A/D converter) according to the present invention.

The A/D converter shown in this figure includes first and second converting units each having a resistor ladder circuit and a voltage comparator group. More specifically, an analog input voltage Vin is commonly input to a plurality of voltage comparators 11 arranged in the first converting unit and respectively constituted by only bipolar transistors, to perform a high-speed operation and to prevent, as much as possible, the generation of an offset voltage. The second converting unit, on the other hand, includes a resistor ladder circuit 12 constituted by a resistors arranged between constant voltages Vref1 and Vref2. A plurality of primary reference voltages having different values, and obtained by the resistor ladder circuit 12, are input to the plurality of voltage comparators 11, are compared with the analog input voltage Vin, and the comparison results of the comparators 11 are input to a plurality of latching logic circuits 13, respectively. In order to keep total power consumption at a minimum, each latching logic circuit 13 has a CMOS arrangement, and upon receipt of the comparison result of a corresponding one of the voltage comparators 11, latches the result and calculates a logical product of the result plus a latched content input from a latching logic circuit 13 adjacent thereto. In this way, points at which comparison signals of the voltage comparators 11 are changed are detected, and outputs therefrom are input to an encoder 14. In the encoder 14, upper bits corresponding to the analog input voltage Vin are generated.

Each latching logic circuit 13 has a corresponding pair of semiconductor switches 15a and 15b which are selectively controlled and enabled in response to an output from the circuit 13. High- and low-level primary reference voltages selected through the semiconductor switches 15a and 15b are input to both terminals of a resistor ladder circuit 18 in the second converting unit through buffer circuits 16 and 17, respectively. A potential difference input to the circuit 18 consists of signal components minus the upper bits, which are not converted by the first converting unit. Therefore, each of a plurality of different secondary reference voltages obtained by the circuit 18 is compared with the analog input voltage Vin by a corresponding one of a plurality of voltage comparators 19 each having latching and logical functions. Note that each of the plurality of voltage comparators 19 in the second converting unit is consistuted entirely of bipolar transistors, this being in order to achieve a high-speed operation and to prevent, as much as possible, the generation of an offset voltage.

Upon latching the comparison result, given one of the plurality of voltage comparators 19 calculates a logical product of the result plus a latched content input from the voltage comparator 19 adjacent thereto. In this way, points at which comparison signals of the voltage comparators 19 are changed are detected, and outputs therefrom are input to an encoder 20. In the encoder 20, lower bits corresponding to the analog input voltage Vin are generated.

Although strict comparison is not required in the case of the plurality of voltage comparators 11 in the first converting unit, a high-speed operation is required, and for this reason, each comparator 11 is constituted by bipolar transistors. On the other hand, each latching logic circuit 13, for receiving the comparison result of the corresponding voltage comparator 11, does not require a high-speed operation but has a CMOS arrangement in order to keep the total power consumption at a minimum.

On the other hand, the plurality of voltage comparators 19 in the second converting unit compare the secondary reference voltages which are lower than the primary reference voltages to determine total conversion precision, so that an accurate and high-speed comparison operation is required. Therefore, each voltage comparator 19 is constituted by bipolar transistors. In addition, the encoder 20 for generating lower bits corresponding to the analog input voltage Vin in response to the outputs from the voltage comparators is also constituted by bipolar transistors, as in the voltage comparators 19. Therefore, an output from the encoder 20 is input to a logic circuit 22 through a level converter 21 for converting a bipolar-level signal into a CMOS-level signal.

The upper bits corresponding to the analog input voltage Vin in the encoder 14 are input to the logic circuit 22. The logic circuit 22 outputs digital converted data Dout corresponding to the analog input voltage Vin in accordance with the upper or lower bits.

Note that reference numeral 23 denotes a clock pulse generator for outputting a clock signal CK1 to be described later to the latching logic circuits 13, and outputting clock signals CK2 and $\overline{CK2}$ to be described later to the voltage comparators 19.

Thus, in the above-mentioned circuit of this embodiment, since each of the voltage comparators 11 and 19 in the first and second converting units which must perform a high-speed operation is constituted by only bipolar transistors, a high-speed operation can be realized as compared with the conventional circuit including the voltage comparators each having a CMOS arrangement. In addition, a variation in voltage $V_{BE}$ of the bipolar transistors which serves as a threshold voltage of each element upon discrimination of signals is at least 1/10 or less as compared with a variation in voltage $V_{TH}$ of the MOS transistors. Therefore, an output error due to an influence of an offset voltage generated in the voltage comparator 11 or 19 can be sufficiently decreased. In addition, since each latching logic circuit 13 and the like which need not perform a high-speed operation has a CMOS arrangement, the power consumption of the entire circuit is not increased.

A detailed arrangement of a main part of the A/D converter having the above arrangement will be described below.

Figure 3:
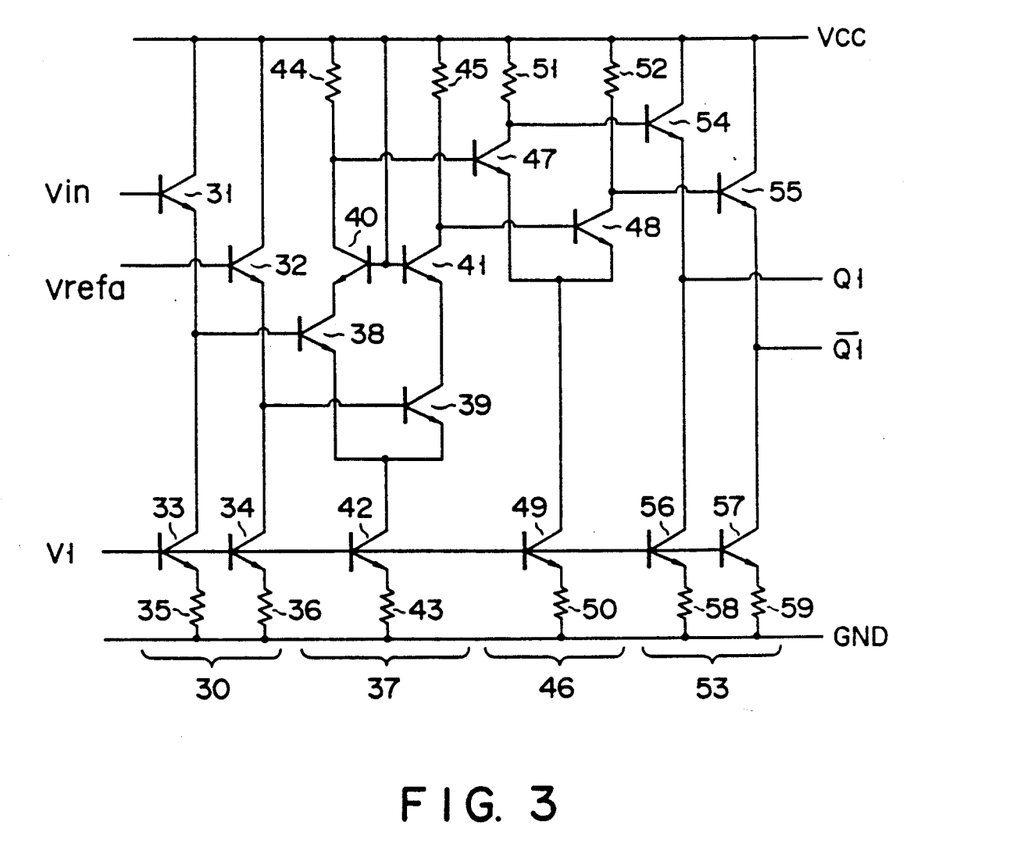
FIG. 3 is a circuit diagram showing a detailed arrangement of each voltage comparator in the first converting unit shown in FIG. 2.

FIG. 3 is a circuit diagram showing a detailed arrangement of each voltage comparator 11 in the first converting unit. The analog input voltage Vin and one primary reference voltage Vrefa are input to an emitter follower amplifier 30. The emitter follower amplifier 30 includes input npn transistors 31 and 32, npn transistors 33 and 34, the bases of which receive a constant bias voltage V1, serving as constant current emitter loads of the transistors 31 and 32, and emitter resistors 35 and 36 of the transistors 33 and 34. An output from the emitter follower amplifier 3 is input to a cascade-type differential amplifier 37. The differential amplifier 37 includes npn transistors 38 to 42, a constant current source resistor 43, and load resistors 44 and 45. An output from the differential amplifier 37 is input to a differential amplifier 46. The differential amplifier 46 includes input npn transistors 47 and 48, a constant current source npn transistor 49, an emitter resistor 50 of the transistor 49, and load resistors 51 and 52. An output from the differential amplifier 46 is extracted from an emitter follower amplifier 53 as signals Q1 and $\overline{Q1}$. The emitter follower amplifier 53 includes npn transistors 54 and 55, npn transistors 56 and 57 serving as constant current emitter loads of the transistors 54 and 55, and resistors 58 and 59.

In the voltage comparator 11 having the above arrangement, when the primary reference voltage Vrefa is lower than the analog input voltage Vin, the output Q1 is set at level "1", and the output $\overline{Q1}$ is set at level "0". On the contrary, when the primary reference voltage Vrefa is higher than the voltage Vin, the output Q1 is set at level "0", and the output $\overline{Q1}$ is set at level "1". Thus, in each of the plurality of voltage comparators 11 constituted by only bipolar transistors in the first converting unit, a sufficient current flows through each element and comparison and amplifying operations are performed, thus achieving a high-speed operation. In addition, a variation in voltages $V_{BE}$ between the base and emitter of the bipolar transistor is at least 1/10 or less of a variation in threshold voltages $V_{TH}$ of the MOS transistor. Therefore, an output error due to an of an offset voltage generated in each voltage comparator can be sufficiently decreased.

Figure 4:
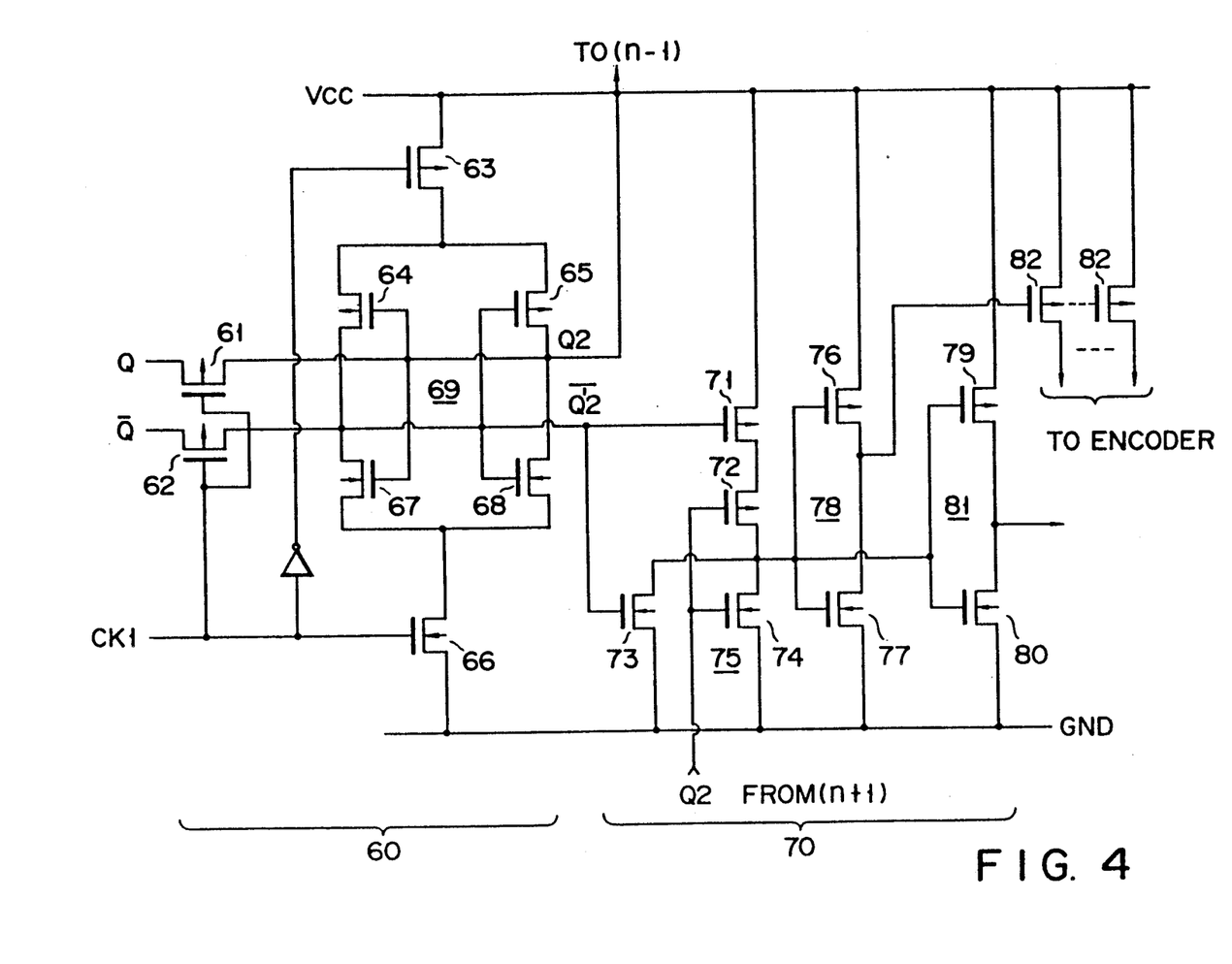
FIG. 4 is a circuit diagram showing a detailed arrangement of the nth logic circuit in the first converting unit shown in FIG. 2.

FIG. 4 is a circuit diagram showing a detailed arrangement of the nth latching logic circuit 13 in the first converting unit. Output signals Q1 and $\overline{Q1}$ output from the corresponding voltage comparator 11 are latched by a latch circuit 60. The latch circuit 60 includes two p-channel MOS transistors 61 and 62 for receiving the signals Q1 and $\overline{Q1}$ in synchronism with a clock signal CK1, and a CMOS latch 69, having p-channel MOS transistors 63, 64, and 65, and n-channel MOS transistors 66, 67, and 68, for latching the signals Q1 and $\overline{Q1}$ input in synchronism with the clock signal CK1. The p-channel MOS transistors 61 and 62 constitute a disconnecting circuit for disconnecting the latch circuit 60 and the voltage comparator 11 while the CMOS latch 69 latches the signals Q1 and Q1. One signal $\overline{Q2}$ latched by the latch circuit 60 is input to a logic circuit stage 70, and the other signal Q2 is input to the logic circuit stage 70 in the (n−1)th logic circuit 13 adjacent to the nth logic circuit 13. The logic circuit stage 70 detects a point at which a comparison signal of the corresponding voltage comparator 11 is changed in response to the output $\overline{Q2}$ from the latch circuit 60 in the nth logic circuit 13 and the output Q2 from the latching logic circuit stage 70 in the (n+1)th logic circuit 13, and generates a signal for controlling the corresponding semiconductor switches 15a and 15b and a signal to be output to the encoder 14 in accordance with the detection result. The logic circuit stage 70 includes a NOR gate 75 having p-channel MOS transistors 71 and 72 and n-channel MOS transistors 73 and 74, CMOS inverters 78 and 81 respectively having p-channel MOS transistors 76 and 79 for inverting an output from the NOR gate 75, and n-channel MOS transistors 77 and 80, and five or less p-channel MOS transistors 82 for outputting and controlling a power supply voltage Vcc corresponding to a signal having level "1" in response to an output from the CMOS inverter 78.

In the latching logic circuit 13 having the above arrangement, for example, an output signal Q1 from the corresponding nth voltage comparator 11 is set at level "1" and a signal $\overline{Q1}$ therefrom is set at level "0", one latch signal Q2 is set at level "1" and the other signal $\overline{Q2}$ is set at level "0". When an output Q2 from the logic circuit stage 70 in the (n+1)th latching logic circuit 13 adjacent to the nth logic circuit 13 is also set at level "0", an output from the NOR gate 75 is set at level "1", and the following output from the CMOS inverter 81 is set at level "0". The corresponding pair of semiconductor switches 15a and 15b controlled by the output from the inverter 81 are turned off. Since an output from the CMOS inverter 78 is also set at level "0", the p-channel MOS transistor is turned on, and a signal having level "1" is input to the encoder 14.

Figure 5:
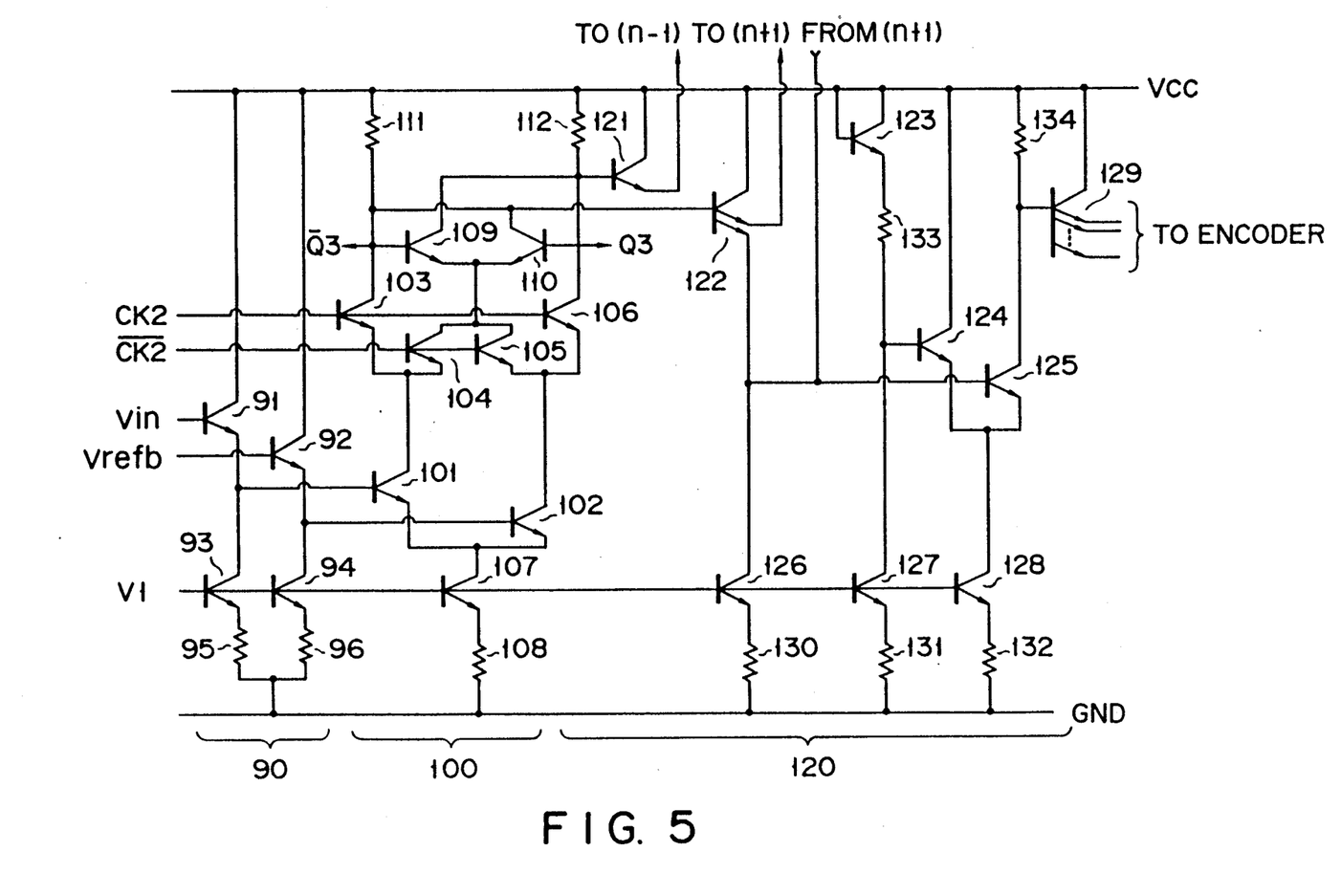
FIG. 5 is a circuit diagram showing a detailed arrangement of the nth voltage comparator in the second converting unit shown in FIG. 2.

FIG. 5 is a circuit diagram showing a detailed arrangement of the nth voltage comparator 19 in the second converting unit. This circuit is constituted by only bipolar transistors, as described above.

More specifically, the analog input voltage Vin and one secondary reference voltage Vrefb are input to an emitter follower amplifier 90. The emitter follower amplifier 90 includes input npn transistors 91 and 92, pnp transistors 93 and 94, the bases of which receive a constant bias voltage V1, serving as constant current emitter loads of the transistors 91 and 92, and emitter resistors 95 and 96 of the transistors 93 and 94. An output from the emitter follower amplifier 90 is input to a differential amplifier 100 having an ECL cascade-type clock sync latch system. The differential amplifier 100 includes npn transistors 101 and 102 for receiving an output from the emitter follower amplifier 90, npn transistors 103 to 106 for receiving a clock signal CK2 or $\overline{CK2}$, an npn transistor 107, the base of which receives a constant bias voltage V1, a constant current source resistor 108 serving as a constant emitter load of the transistor 107, output npn transistors 109 and 110, and load resistors 111 and 112. The differential amplifier 100 outputs signals Q3 and $\overline{Q3}$ corresponding to the comparison result between the analog input voltage Vin and the secondary reference voltage Vrefb. The outputs Q3 and $\overline{Q3}$ from the differential amplifier 100 are input to a logic stage 120. The logic stage 120 includes npn transistors 121 to 129, constant current source resistors 130 to 132, and load resistors 133 and 134, and detects a point at which a comparison signal is changed using an output from the logic stage 120 adjacent thereto.

Figure 6:
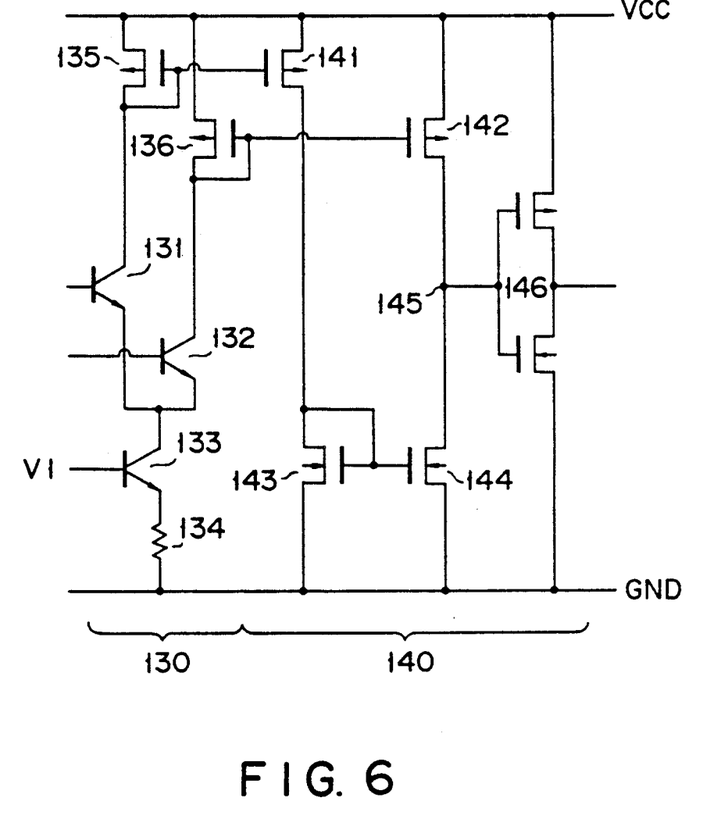
FIG. 6 is a circuit diagram showing a detailed one-bit arrangement of the level converter shown in FIG. 2.

FIG. 6 is a circuit diagram showing a detailed one-bit arrangement of the level converter 21 for converting a bipolar level of an output from the encoder 20 into a CMOS level. This circuit 21 includes a differential amplifier 130 for receiving outputs Q3 and $\overline{Q3}$ from the encoder 20, and a CMOS output stage 140 for receiving an output from the differential amplifier 130. The differential amplifier 130 includes npn transistors 131 and 132 for receiving the outputs Q3 and Q3 output from the encoder 20, an npn transistor 133, the base of which receives the constant bias voltage V1, serving as a constant current emitter load of the transistors 131 and 132, an emitter resistor 134 of the transistor 133, and p-channel MOS transistors 135 and 136 in which a path between the gate and the drain is short-circuited, serving as loads of the transistors 131 and 132. The CMOS output stage 140 includes p-channel MOS transistors 141 and 142 constituting a current mirror circuit with the p-channel MOS transistors 135 and 136 in the differential amplifier 130, n-channel MOS transistors 143 and 144 constituting a current mirror circuit, the input terminal of which is connected to the MOS transistor 141 and the output terminal of which is connected to the MOS transistor 142, and a CMOS inverter 146 for receiving a signal of a node 145 of the MOS transistors 142 and 144. Thus, the level converter 21 is constituted by bipolar transistors and p- and n-channel MOS transistors.

The present invention is not limited to the above embodiment, and various changes and modifications can be made, as a matter of course. For example, a case wherein the present invention is applied to the A/D converter including the first and second converting units has been described in the above embodiment. However, even if a one-stage conversion arrangement wherein a digital converted value is obtained based on a comparison result obtained by causing the voltage comparator to compare an input analog voltage with a plurality of reference voltages obtained by a resistor ladder circuit may be employed, the voltage comparator may be constituted by only the bipolar transistors, so that a very low analog input voltage having a high frequency ca be converted with high precision.

What is claimed is:

1. An analog/digital converter comprising:
a first comparator group, in which each comparator is constituted by bipolar transistors, for comparing a plurality of different primary reference voltages with an analog input voltage;
a latch circuit group having a latch circuit which is constituted by MOS transistors, for latching comparison results of said first comparator group;
means for obtaining a first digital converted value corresponding to the analog input voltage, in accordance with storage contents of said latch circuit group;
selecting means for selecting a high-level primary reference voltage approximate to the analog input voltage and a low-level primary reference voltage, in accordance with the storage contents of said latch circuit group;
secondary reference voltage generating means for dividing a potential difference between the high-level and the low-level primary reference voltages selected by said selecting means, to generate a plurality of secondary reference voltages generated by a primary voltage generating means;
a second comparator group, in which each comparator is constituted by bipolar transistors, for comparing the plurality of secondary reference voltages generated by said secondary reference voltage generating means with the analog input voltage;
means for obtaining a second digital converted value corresponding to the analog input voltage, in accordance with comparison results of said second comparator group; and
means for obtaining a digital converted value corresponding to the analog input voltage, in accordance with the first and second digital converted values.

2. The p-channel MOS transistors 61 and 62 constitute a disconnecting circuit for disconnecting the latch circuit 60 and the voltage comparator 11 while the CMOS latch 69 latches the signals Q1 and Q1.

3. An analog/digital converter comprising:
primary reference voltage generating means for generating a plurality of different primary reference voltages;
a first comparator group, in which each comparator is constituted by bipolar transistors, for comparing the plurality of different primary reference voltages with an analog input voltage;
a latch circuit group having a latch circuit which is constituted by MOS transistors, for latching comparison results of said first comparator group;
means for obtaining a first digital converted value corresponding to the analog input voltage, in accordance with storage contents of said latch circuit group;
selecting means for selecting a high-level primary reference voltage approximate to the analog input voltage and a low-level primary reference voltage, in accordance with the storage contents of said latch circuit group;
secondary reference voltage generating means for dividing a potential difference between the high-level and the low-level primary reference between the high-level and the low-level primary reference voltages selected by said selecting means, to generate a plurality of secondary reference voltages;
a secondary comparator group, in which each comparator is constituted by bipolar transistors, for comparing the plurality of secondary reference voltages with the analog input voltage;
first means for obtaining a second digital converted value corresponding to the analog input voltage, in accordance with comparison results of said second comparator group;
level converting means for converting a bipolar level output from said first means into a CMOS level; and
second means for obtaining a digital converted value corresponding to the analog input voltage, in accordance with the first and second digital converted values.

4. An analog/digital converter according to claim 3 wherein the latch circuit of said latch circuit group includes a disconnecting circuit which disconnects a connection between each comparator of said first comparator group and the latch circuit while said latch circuit latches said comparison result of said first comparator group.

* * * * *